(12) United States Patent
Brody et al.

(10) Patent No.: US 7,911,130 B2
(45) Date of Patent: Mar. 22, 2011

(54) RECEPTACLES FOR INKJET DEPOSITED PLED/OLED DEVICES AND METHOD OF MAKING THE SAME

(75) Inventors: Thomas P. Brody, Pittsburgh, PA (US); Jan Bernkopf, Valencia, PA (US)

(73) Assignee: Advantech Global, Ltd., Tortola (VG)

( * ) Notice: Subject to any disclaimer, the term of this patent is extended or adjusted under 35 U.S.C. 154(b) by 271 days.

(21) Appl. No.: 11/826,132

(22) Filed: Jul. 12, 2007

(65) Prior Publication Data
US 2007/0262710 A1    Nov. 15, 2007

Related U.S. Application Data

(62) Division of application No. 10/949,214, filed on Sep. 27, 2004, now abandoned.

(51) Int. Cl.
*H01J 1/62* (2006.01)
*H01J 63/04* (2006.01)
(52) U.S. Cl. .................. 313/504; 313/503; 313/292
(58) Field of Classification Search .......... 313/495–512, 313/581–587, 292; 445/24, 25; 427/66
See application file for complete search history.

(56) References Cited

U.S. PATENT DOCUMENTS

| | | | | |
|---|---|---|---|---|
| 1,910,160 | A | * | 5/1933 | Gorman .......................... 52/460 |
| 3,835,614 | A | * | 9/1974 | Downing, Jr. .................. 52/666 |
| 4,060,950 | A | * | 12/1977 | Rackard et al. ................. 52/456 |
| 4,712,165 | A | * | 12/1987 | Cetrone ........................ 362/147 |
| 4,723,388 | A | * | 2/1988 | Zieg .............................. 52/665 |
| 5,553,854 | A | * | 9/1996 | Rum ............................. 273/275 |
| 5,561,343 | A | | 10/1996 | Lowe |
| 5,609,007 | A | * | 3/1997 | Eichner ........................ 52/747.1 |
| 5,695,378 | A | * | 12/1997 | Hecker et al. ................... 445/24 |
| 5,910,703 | A | * | 6/1999 | Kuo et al. ...................... 313/482 |
| 5,989,090 | A | * | 11/1999 | Perrin et al. .................... 445/24 |
| 6,008,582 | A | | 12/1999 | Asano et al. |
| 6,114,022 | A | | 9/2000 | Warner et al. |
| 6,198,457 | B1 | * | 3/2001 | Walker et al. ................. 343/840 |
| 6,249,264 | B1 | | 6/2001 | Sano et al. |
| 6,312,302 | B1 | * | 11/2001 | Na ................................ 445/24 |
| 6,479,933 | B1 | * | 11/2002 | Chen ............................ 313/582 |
| 6,514,599 | B1 | | 2/2003 | Ali et al. |
| 6,582,756 | B1 | * | 6/2003 | Antoniadis et al. ............. 427/66 |
| 6,612,086 | B2 | * | 9/2003 | Pitt ............................... 52/665 |
| 6,630,785 | B1 | | 10/2003 | Lu |
| 6,670,756 | B2 | * | 12/2003 | Lin et al. ....................... 313/582 |
| 6,696,180 | B2 | | 2/2004 | Doi et al. |
| 6,696,225 | B1 | | 2/2004 | Kanbe et al. |
| 6,713,959 | B1 | * | 3/2004 | Toyoda et al. ................. 313/582 |
| 6,767,774 | B2 | | 7/2004 | Sundahl et al. |
| 7,046,218 | B2 | * | 5/2006 | Akiba ............................ 345/60 |

(Continued)

FOREIGN PATENT DOCUMENTS

JP        08326180  A  * 12/1996

*Primary Examiner* — Nimeshkumar D Patel
*Assistant Examiner* — Glenn Zimmerman
(74) *Attorney, Agent, or Firm* — Dickstein Shapiro LLP

(57) ABSTRACT

Evaporated receptacles for inkjet deposited polymeric light-emitting diode (PLED)/organic light-emitting diode (OLED) and a method of making the same. The evaporated receptacles are formed via a shadow mask vacuum deposition process. The method of forming a light-emitting display includes forming an electrode on a substrate, forming a receptacle structure over the electrode via a shadow mask vacuum deposition process, and delivering a quantity of polymeric solution, which contains a light-emitting material, into the receptacle via a standard inkjet deposition process.

7 Claims, 9 Drawing Sheets

U.S. PATENT DOCUMENTS

| | | |
|---|---|---|
| 7,371,508 B2 * | 5/2008 | Toyoda et al. ............... 430/321 |
| 2001/0005189 A1 | 6/2001 | Nunomura |
| 2001/0013747 A1 * | 8/2001 | Jung et al. .................... 313/292 |
| 2002/0009536 A1 | 1/2002 | Iguchi et al. |
| 2002/0177687 A1 | 11/2002 | Noguchi et al. |
| 2002/0187265 A1 | 12/2002 | Mori et al. |
| 2003/0007033 A1 | 1/2003 | Ito et al. |
| 2003/0052596 A1 * | 3/2003 | Yi et al. ........................ 313/504 |
| 2003/0115823 A1 * | 6/2003 | Colefax et al. ................ 52/677 |
| 2003/0151355 A1 * | 8/2003 | Hosokawa ................... 313/504 |
| 2003/0151700 A1 | 8/2003 | Carter et al. |
| 2004/0168630 A1 * | 9/2004 | Suzuki et al. ................ 118/300 |
| 2004/0207312 A1 * | 10/2004 | Takashima et al. ........... 313/503 |
| 2004/0219859 A1 * | 11/2004 | Yamazaki et al. ............. 445/24 |
| 2004/0232832 A1 * | 11/2004 | Kubota ........................ 313/512 |
| 2005/0079277 A1 * | 4/2005 | Takashima et al. ............ 427/58 |
| 2005/0153114 A1 * | 7/2005 | Gupta et al. .................. 428/201 |
| 2005/0190253 A1 * | 9/2005 | Duineveld et al. ............ 347/106 |
| 2006/0028124 A1 * | 2/2006 | Chu et al. ..................... 313/504 |

* cited by examiner

RECEPTACLES FOR INKJET DEPOSITED PLED/OLED DEVICES AND METHOD OF MAKING THE SAME

CROSS-REFERENCE TO RELATED APPLICATIONS

This application is a divisional of U.S. patent application Ser. No. 10/949,214, filed on Sept. 27, 2004 now abandoned, the subject matter of which is incorporated in its entirety by reference herein.

FIELD OF THE INVENTION

The present invention relates to an inkjet deposition process for forming polymeric light-emitting diode (PLED) or organic light-emitting diode (OLED) displays. In particular, the invention relates to forming evaporated receptacles for inkjet deposited PLED/OLED devices.

BACKGROUND OF THE INVENTION

An organic light-emitting diode (OLED) is a light-emitting diode (LED) made of semiconducting organic polymers. These devices promise to be much cheaper to fabricate than inorganic LEDs. Varying amounts of OLEDs can be deposited in arrays on a screen by use of simple "printing" methods to create a graphical color display, for use as television screens, computer displays, portable system screens, and in advertising and information board applications. OLED panels may also be used as lighting devices.

One of the great benefits of an OLED display over the traditional liquid crystal displays found in computer monitors is that OLED displays do not require a backlight in order to function. This means that they draw far less power and can be used with small portable devices, which have mostly made use of monochrome, low-resolution displays, in order to conserve power. This also means that they are able to last for long periods of time on a single battery charge.

There are two main directions in OLED technology. The first OLED technology was developed by Eastman Kodak Company (Rochester, N.Y.) and is usually referred to as "small-molecule" OLED. The production of small-molecule displays requires a vacuum deposition process, which makes the production process expensive and inflexible. A second OLED technology, developed by Cambridge Display Technology (Cambridge, UK), is a polymer-based OLED technology, which is sometimes referred to as PLED technology. Although development of PLED technology lags behind the development of small-molecule OLED technology by several years, it promises some advantages. For example, the organic electroluminescent materials can be applied on the substrate by a technique derived from commercial inkjet printing, which means that PLED displays can be made in a very flexible and inexpensive way.

Producing a multi-color organic display is not an easy task. While the use of inkjet printing techniques for forming PLED displays has found some acceptance in forming displays with larger feature sizes, the technique has, so far, depended on a complex and costly photolithography process for forming the receptacles upon the display substrate. The receptacles, or wells, are structures that are formed upon a substrate into which, in the case of a PLED display, the droplets of polymer solution are collected during an inkjet deposition process. What is needed is a simpler and less costly process for forming receptacles upon a display substrate for use in a subsequent inkjet deposition process that delivers the polymer solvent thereon for completing the display fabrication.

One exemplary method of forming a light-emitting display by use of an inkjet deposition process is found in reference to U.S. Pat. No. 6,767,774, entitled, "Producing Multi-color Stable Light-Emitting Organic Displays." The '774 patent describes a polymer or organic light-emitting display that may be formed on a substrate by patterning the light-emitting material by use of a screen printing technique. In this way, displays may be formed economically and overcome the difficulties associated with photoprocessing light-emitting materials. A binary optic material may be selectively incorporated into sol gel coatings and coated over light-emitting elements formed from the light-emitting material. A tricolor display may be produced by use of a light-emitting material that produces a single color.

While the '774 patent describes a suitable method of forming a light-emitting display by use of an inkjet deposition process, it makes no mention of providing simpler or more inexpensive ways to form the receptacle structures upon a substrate for use in the inkjet deposition process.

It is therefore an object of the invention to provide a simplified and inexpensive process for forming receptacles upon a display substrate for use in a subsequent inkjet deposition process for forming a large-area PLED/OLED display.

It is another object of this invention to provide a method of using a shadow mask vacuum deposition process for forming receptacles upon a display substrate for use in a subsequent inkjet deposition process.

BRIEF SUMMARY OF THE INVENTION

The present invention relates to evaporated receptacles for inkjet deposited PLED/OLED device and a method of making such devices. In accordance with one aspect of the invention, a light-emitting display is made by forming a substrate with an electrode disposed thereon, forming a receptacle structure over the electrode via a shadow mask vacuum deposition process, and delivering a quantity of polymeric solution, which contains a light-emitting material, into the receptacle via a standard inkjet deposition process.

The present invention avoids the use of a complex and costly photolithography process for forming the receptacles upon the display substrate. As a result, the combination of using a shadow mask vacuum deposition process to form the inkjet receptacles and the use of an inkjet deposition process to deliver the light-emitting material provides a less complex and more cost-effective way to make polymer displays of any desired dimension.

Other features and advantages of the present invention will become more apparent from the detailed description of exemplary embodiments provided below with reference to the accompanying drawings in which:

DETAILED DESCRIPTION OF THE INVENTION

Figure 1:
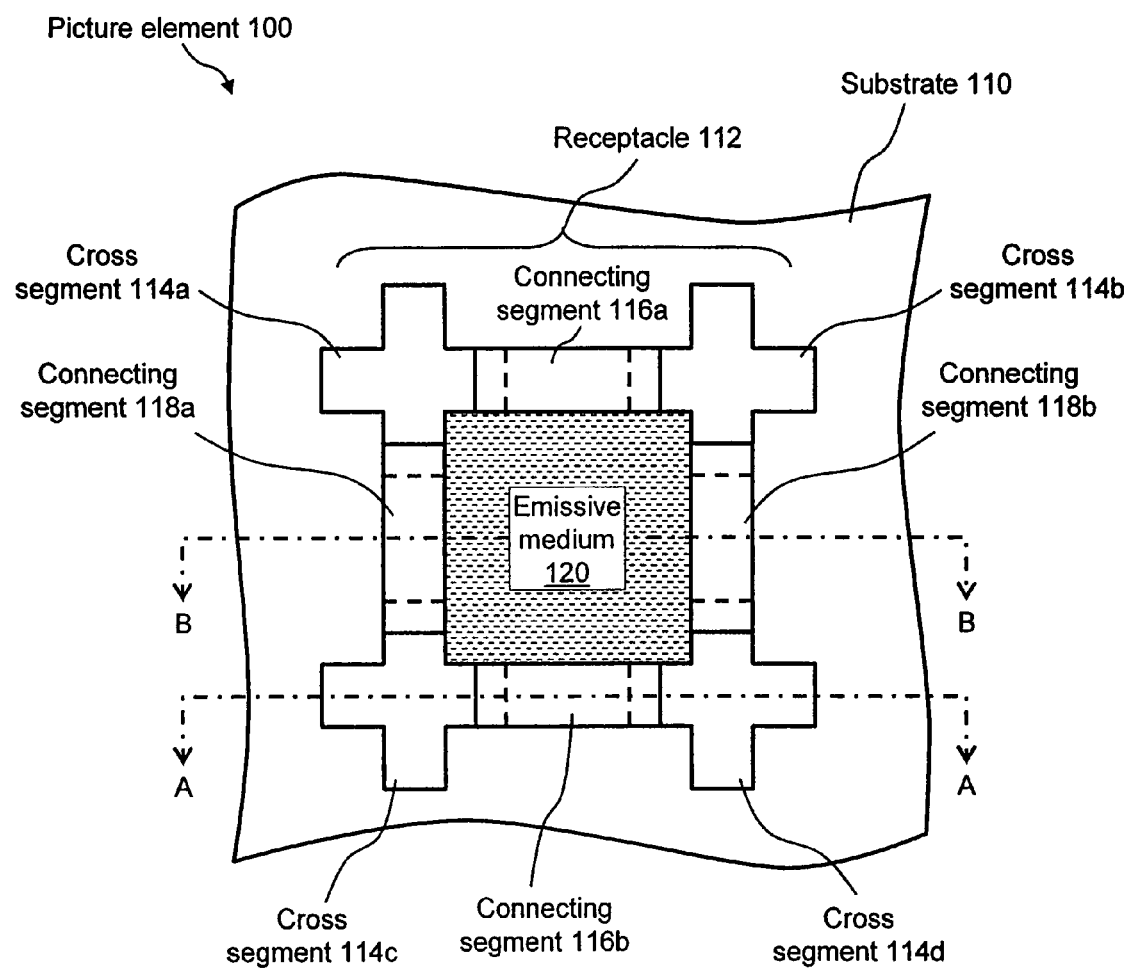
FIG. 1 illustrates a top view of a picture element in accordance with a first embodiment of the invention.

FIG. 1 illustrates a top view of a picture element 100 in accordance with a first embodiment of the invention. Picture element 100 is a representative pixel of a flat-panel display, such as a PLED or OLED display. Picture element 100 includes a substrate 110 upon which is formed a receptacle 112. Receptacle 112 is formed by an arrangement of evaporated segments. Receptacle 112 is formed of a plurality of cross segments 114 arranged on a grid that are interconnected via a plurality of connecting segments 116 and connecting segments 118, which form the walls of receptacle 112 for retaining liquid solvent during an inkjet deposition process.

In this example, receptacle 112 is formed of a cross segment 114a, a cross segment 114b, a cross segment 114c, and a cross segment 114d, arranged on a grid as shown in FIG. 1. Cross segments 114a and 114b are interconnected via a connecting segment 116a to form a first wall of receptacle 112; cross segments 114c and 114d are interconnected via a connecting segment 116b to form a second wall of receptacle 112; cross segments 114a and 114c are interconnected via a connecting segment 118a to form a third wall of receptacle 112; and cross segments 114b and 114d are interconnected via a connecting segment 118b to form a fourth wall of receptacle 112.

Deposited within the walls of receptacle 112 that are formed by the combination of cross segments 114, connecting segments 116, and connecting segments 118 is a quantity of emissive medium 120.

Substrate 110 is formed of any standard substrate material that is suited for a shadow mask evaporation process, such as metal foil, plastic, or glass.

Cross segments 114, connecting segments 116, and connecting segments 118 of receptacle 112 are formed of via a shadow mask evaporation process. The material for forming cross segments 114, connecting segments 116, and connecting segments 118 is an organic hydrophobic material that is suited for use with an inkjet deposition process and also suited for use with a shadow mask evaporation manufacturing process. While the literal definition of the word "hydrophobic" is roughly to repel water, for the purposes of this disclosure "hydrophobic" shall mean that the adhesiveness to a polymeric solution, which contains a light-emitting material, is low (affinity). By contrast, while the literal definition of the word "hydrophilic" is roughly to attract water, for the purposes of this disclosure "hydrophilic" shall mean that the adhesiveness to a polymeric solution, which contains a light-emitting material, is high (affinity). Both expressions are used for the sake of convenience as a comparison to clarify the degree of affinity against the polymeric solution.

Examples of organic hydrophobic materials for forming cross segments 114, connecting segments 116, and connecting segments 118 of receptacle 112 are (poly) vinyl alcohol, (poly)acrylate or polyimide. The design objective is for the solid material forming cross segments 114, connecting segments 116, and connecting segments 118 of receptacle 112 to have a surface energy higher than the surface tension of the polymeric solution deposited therein and, thus, the structure forming receptacle 112 repels the polymeric solution. Further details of the formation of cross segments 114, connecting segments 116, and connecting segments 118 of receptacle 112 via the shadow mask evaporation process are found in reference to FIGS. 4 and 5.

Emissive medium 120 is representative of a light emissive solid polymer layer that is deposited via a standard inkjet process whereby a volume of solvent with polymeric material dissolved therein is deposited within receptacle 112 and allowed to dry, which leaves only a solid layer of light emissive material. Commercially available polymeric solvents are, for example, Xylene; Toluene; benzene compounds, such as trimethylbenzene, chlorobenzene; dichlorobenzene supplied by Shell Chemical Corporation (Houston, Tex.); or proprietary mixtures including these chemicals, such as supplied by Dow Corning Corporation (Midland, Mich.).

Figure 2:
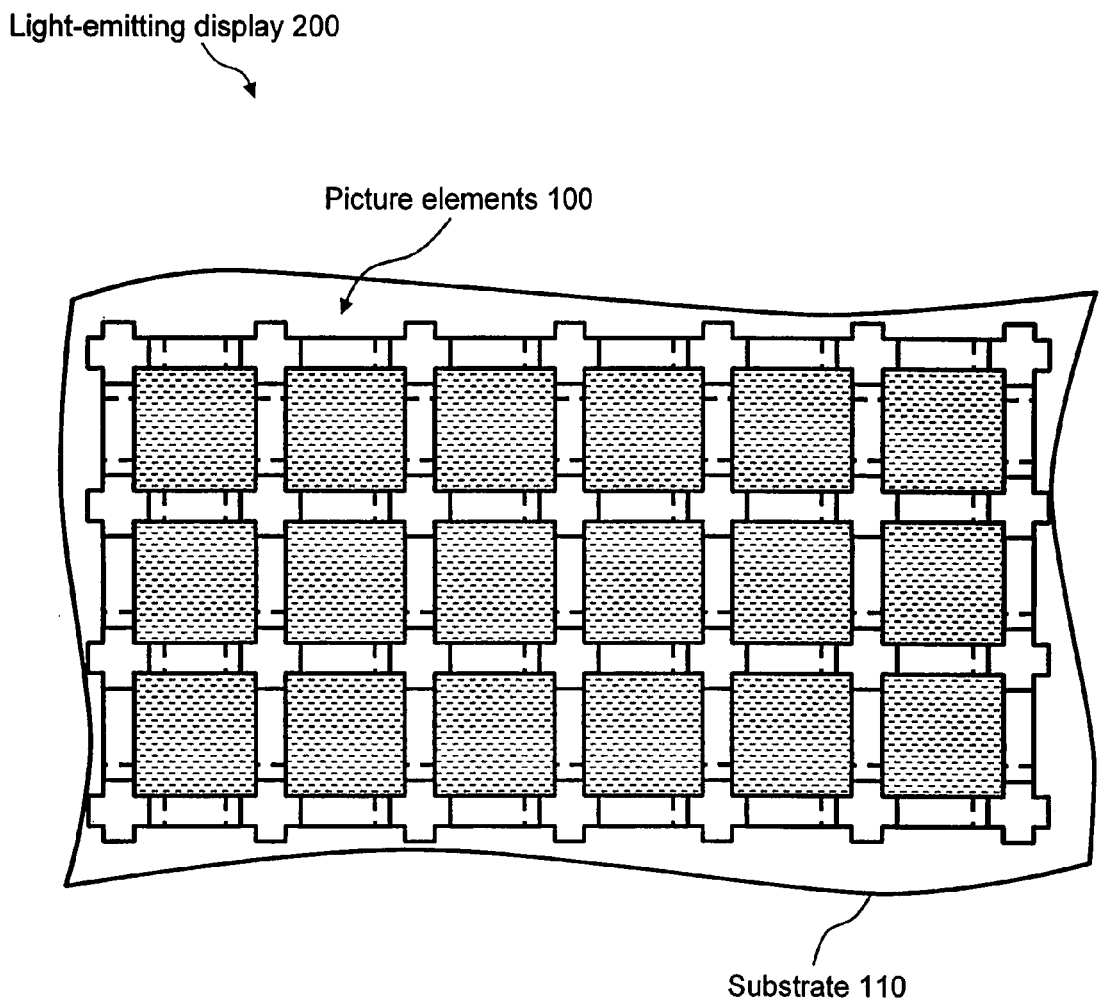
FIG. 2 illustrates an example light-emitting display formed of a plurality of picture elements of the present invention.

FIG. 2 illustrates an example of a light-emitting display 200 formed of a plurality of picture elements 100, as described in FIG. 1. Receptacles 112 of picture elements 100 are formed upon substrate 110 via a shadow mask vacuum deposition process. Subsequently, emissive medium 120 is deposited within receptacles 112 via a standard inkjet process in order to complete the formation of light-emitting display 200. Further details of the inkjet process are found in reference to FIGS. 3A and 3B.

Figure 3A:
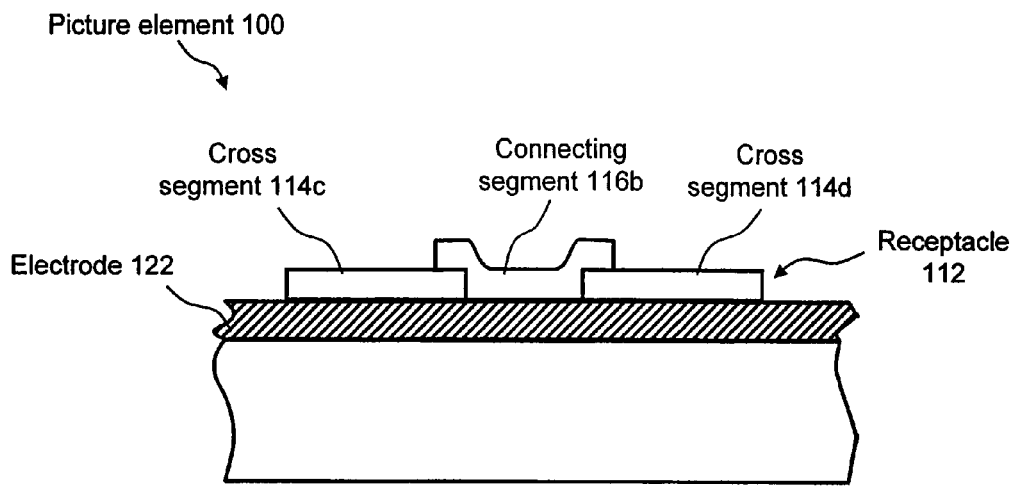
FIG. 3A illustrates a cross-sectional view of the picture element of the present invention taken along line A-A of FIG. 1.

FIG. 3A illustrates a cross-sectional view of picture element 100 taken along line A-A of FIG. 1. Cross segments 114c and 114d and connecting segment .116b are deposited atop an electrode 122, which is a portion of the circuitry of picture element 100 that is deposited atop substrate 110. Cross segments 114c and 114d are interconnected with connecting segment 116b to form a continuous wall of receptacle 112. Connecting segment 116b is deposited, such that it overlaps slightly atop cross segment 114c on one end and overlaps slightly atop cross segment 114d on its opposing end, so that it fills the gap between cross segments 114c and 114d in order to form a continuous wall, as shown in FIG. 3A.

Electrode 122 is formed of an electrically conductive hydrophilic material, such as indium-tin oxide (ITO), as commonly used in bottom emitting PLED displays, or metal, such as nickel covered with a thin (5-50 angstrom thickness) nickel oxide formed by exposure of the nickel film to plasma in the presence of oxygen. The design objective is for the solid material forming electrode 122 to have a surface energy lower than the surface tension of the polymeric solution deposited thereon and, thus, electrode 122 attracts the polymeric solution.

Figure 3B:
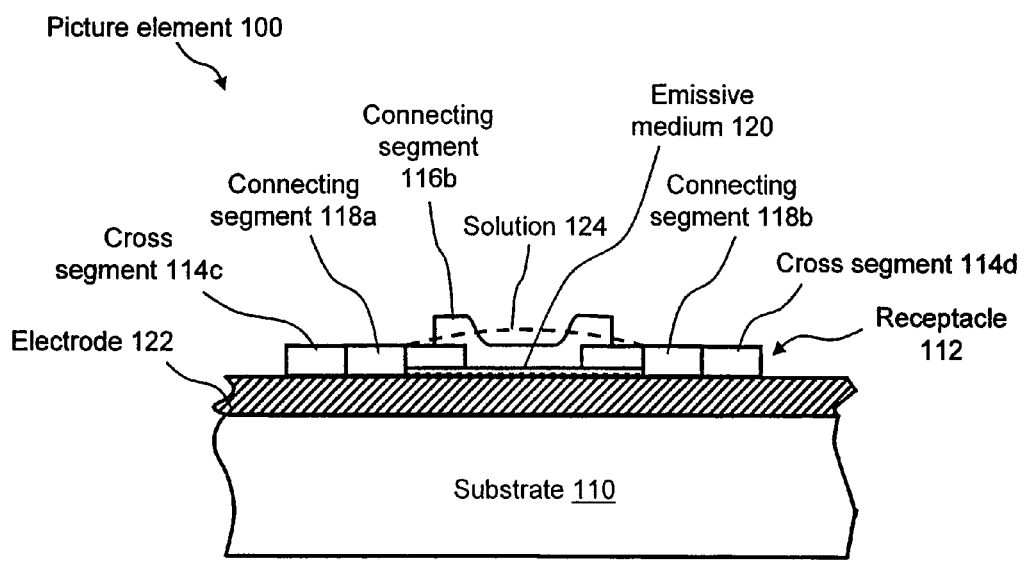
FIG. 3B illustrates a cross-sectional view of the picture element of the present invention taken along line B-B of FIG. 1.

FIG. 3B illustrates a cross-sectional view of picture element 100 taken along line B-B of FIG. 1. FIG. 3B shows that emissive medium 120 is bounded by the well structure of receptacle 112 that is formed by the combination of cross segments 114, connecting segment 116, and connecting segments 118. FIG. 3B further shows receptacle 112 filled with a solution 124, which is representative of a polymeric solution, as described in reference to FIG. 1.

For simplicity FIGS. 3A and 3B are shown without the electronic active matrix circuit, which is typically positioned between electrode 122 and substrate 110.

With reference to FIGS. 1, 2, 3A, and 3B, cross segments 114, connecting segments 116, and connecting segments 118 of receptacle 112, are formed via a shadow mask evaporation system, such as described in reference to U.S. Patent Application No. 2003/0228715, entitled, "Active Matrix Backplane for Controlling Controlled Elements and Method of Manufacture Thereof," assigned to Amedeo Corporation (Pittsburgh, Pa.), which is incorporated herein by reference. The '715 patent application describes an electronic device formed from electronic elements deposited on a substrate. The electronic elements are deposited on the substrate by the advancement of the substrate through a plurality of deposition vacuum vessels that have at least one material deposition source and a shadow mask positioned therein. The material from at least one material deposition source positioned in each deposition vacuum vessel is deposited on the substrate through the shadow mask that is positioned in the deposition vacuum vessel, in order to form on the substrate a circuit formed of an array of electronic elements. The circuit is formed solely by the successive deposition of materials on the substrate.

Cross segments 114, connecting segments 116, and connecting segments 118 of receptacle 112 are formed with a thickness of, for example, 2 microns and with a width as is practical, depending on the pitch of picture elements 100 upon substrate 110. For example, the width of the walls of each receptacle 112 formed by cross segments 114, connecting segments 116, and connecting segments 118 may be in the range of 10 to 20 micrometers.

With continuing reference to FIGS. 1, 2, 3A, and 3B, during a standard inkjet deposition process, a printhead sweeps across the area of a target display, such as light-emitting display 200 of FIG. 2, and delivers droplets of solution 124 of a predetermined volume into the receptacles 112 thereof. By doing so, each receptacle 112 is filled or slightly overfilled to a uniform level with a predetermined quantity of solution 124, as shown in FIG. 3B. The droplets of solution 124 are repelled by the hydrophobic material that forms the walls of each receptacle 112, while, at the same time, the droplets of solution 124 are pulled into each receptacle 112 by the surface energy of the hydrophilic material of electrode 122. In this way, each droplet of solution 124 is drawn to its intended location within each picture element 100 of the target display, such as light-emitting display 200 of FIG. 2. The display then experiences a drying event, whereby the liquid within solution 124 evaporates and leaves behind only the solids within solution 124 as a thin, solid, uniform layer of emissive material, i.e., emissive medium 120.

Figure 4:
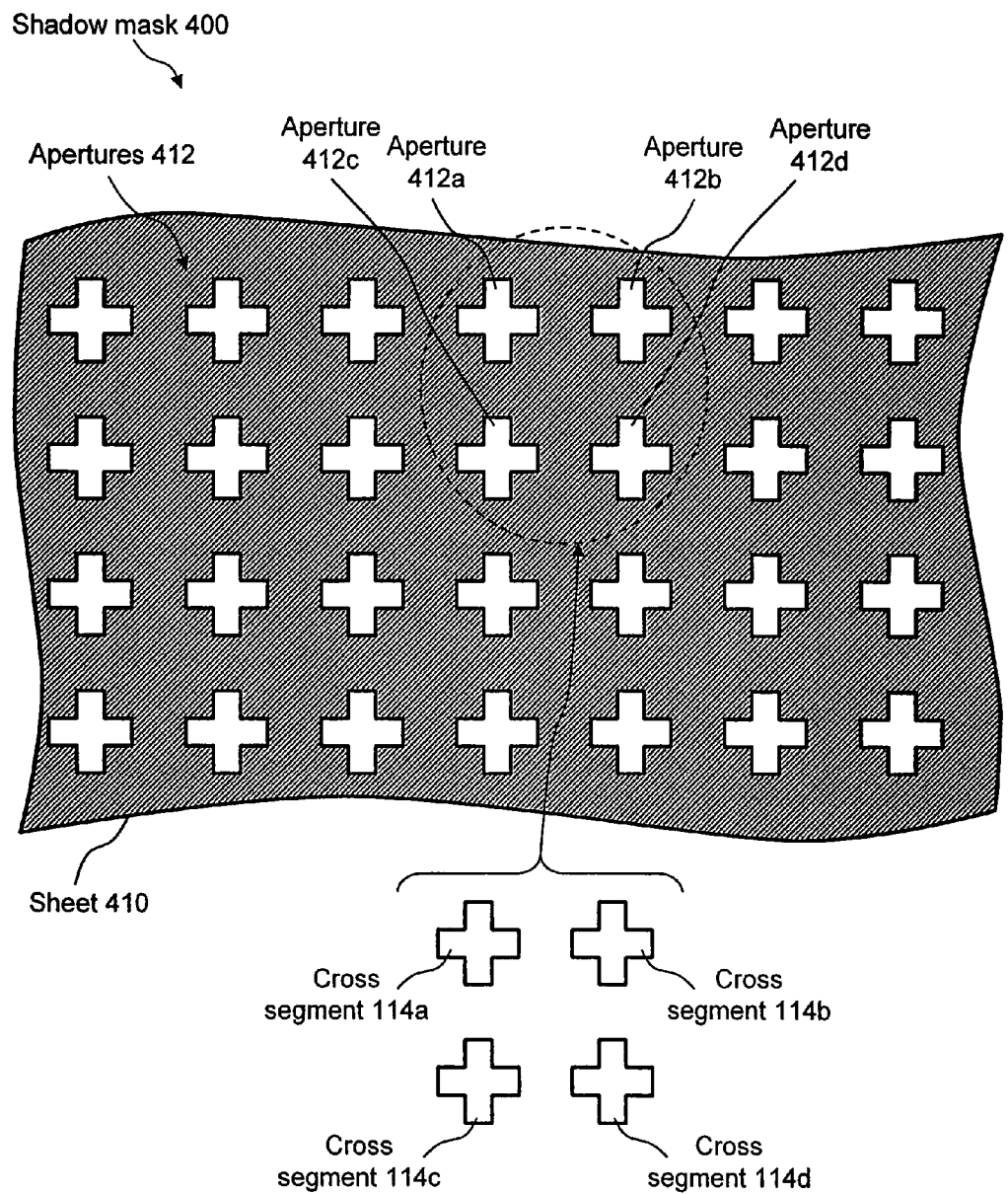
FIG. 4 illustrates a top view of an exemplary shadow mask for forming an arrangement of receptacle cross segments via a shadow mask vacuum deposition process in accordance with a first embodiment of the invention.

FIG. 4 illustrates a top view of an exemplary shadow mask 400 for forming an arrangement of cross segments 114 of a plurality of receptacles 112 via a shadow mask vacuum deposition process in accordance with a first embodiment of the invention. Shadow mask 400 includes a sheet 410 formed of, for example, nickel, chromium, steel, copper, Kovar, or Invar. Kovar and Invar are materials with a low coefficient of thermal expansion (CTE) known commercially as KOVAR™ or INVAR™ and are supplied, for example, by ESPICorp Inc. (Ashland, Oreg.). Formed within sheet 410 is a pattern of apertures 412, which are openings of a predetermined size, shape, and location, for forming an arrangement of cross segments 114. With reference to FIGS. 1 and 4, shadow mask 400 includes, for example, an aperture 412a for forming cross segment 114a, an aperture 412b for forming cross segment 114b, an aperture 412c for forming cross segment 114c, and an aperture 412d for forming cross segment 114d.

The location of apertures 412 are set on a pitch, as determined by an associated layout of picture elements 100 for a given display design. More specifically, the pitch of apertures 412 is dependent on the number of pixels per inch of a given display design. For example, the pitch of apertures 412 may be in the range of 100 to 500 µm, which equates to 250 to 50 pixels per inch, respectively.

Shadow mask 400 is suitable for use in a vacuum vessel of one deposition stage of an evaporation system. An example of a shadow mask evaporation system and method for forming cross segments 114, connecting segments 116, and connecting segments 118 of receptacle 112 is described in reference to the '715 patent application.

Optionally, one or more shadow masks, such as shadow mask 400, in one or more successive deposition stages, respectively, of an evaporation process may be required for forming the full arrangement of cross segments 114 for any given display design, depending on the pitch of the design. The requirement is that the structural integrity and strength of the shadow masks, such as shadow mask 400, be suitably maintained with any given layout of apertures 412.

Figure 5:
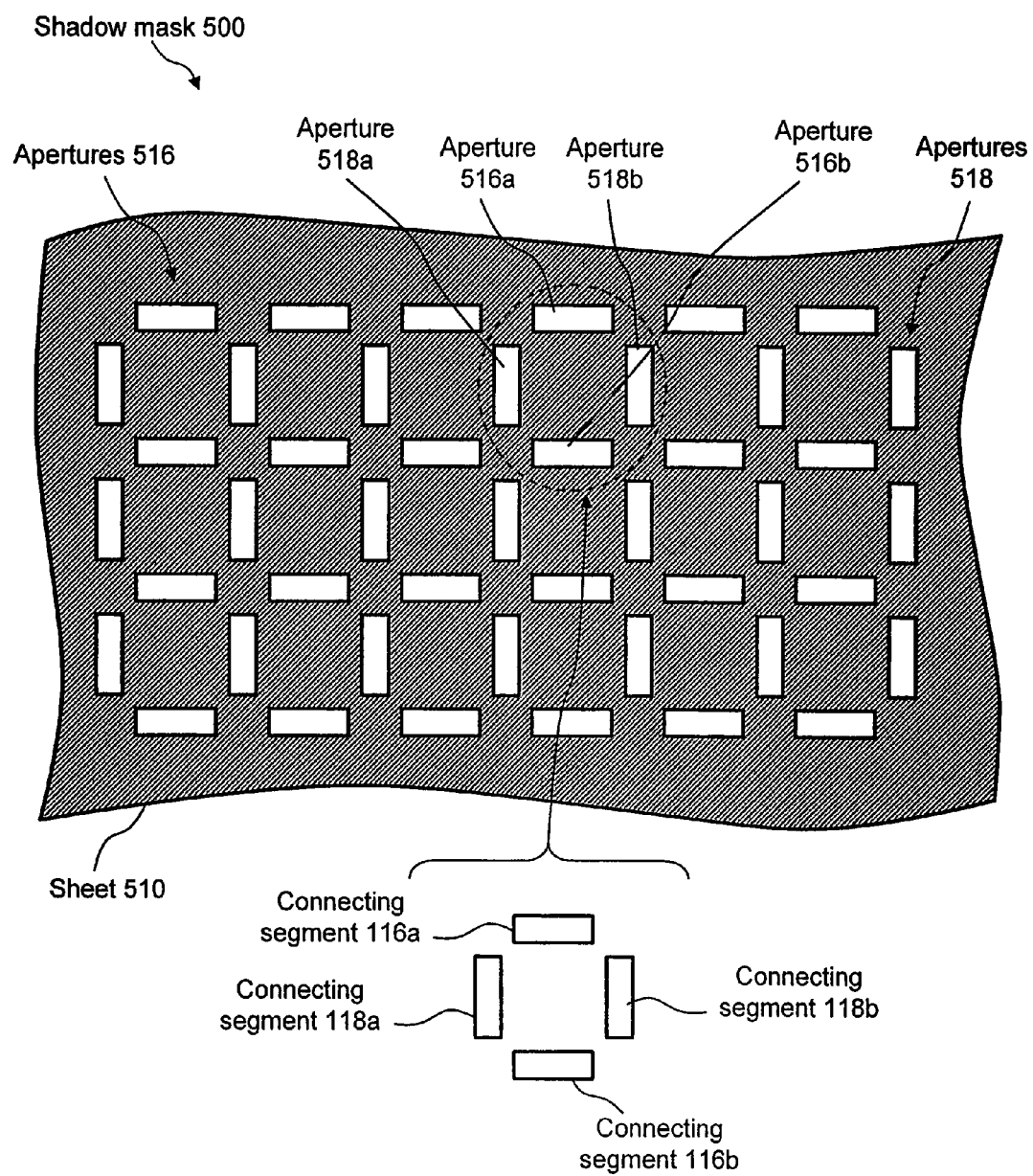
FIG. 5 illustrates a top view of an exemplary shadow mask for forming an arrangement of receptacle connecting segments via a shadow mask vacuum deposition process in accordance with a first embodiment of the invention.

FIG. 5 illustrates a top view of an exemplary shadow mask 500 for forming an arrangement of connecting segments 116 and connecting segments 118 of a plurality of receptacles 112 via a shadow mask vacuum deposition process in accordance with a first embodiment of the invention. Shadow mask 500 includes a sheet 510 formed of, for example, nickel, chromium, steel, copper, Kovar, or Invar. Formed within sheet 510 is a pattern of apertures 516 and apertures 518, which are openings of a predetermined size, shape, and location, for forming an arrangement of connecting segments 116 and 118, respectively. With reference to FIGS. 1 and 5, shadow mask 500 includes, for example, an aperture 516a for forming connecting segment 116a, an aperture 516b for forming connecting segment 116b, an aperture 518a for forming connecting segment 118a, and an aperture 518b for forming connecting segment 118b.

The location of apertures 516 and 518 are set on a pitch, as determined by an associated layout of picture elements 100 for a given display design. More specifically, the pitch of apertures 516 and 518 is dependent on the number of pixels per inch of a given display design. For example, the pitch of apertures 516 and 518 may be in the range of 100 to 500 µm, which equates to 250 to 50 pixels per inch, respectively.

Shadow mask 500 is suitable for use in a vacuum vessel of one deposition stage of an evaporation system. An example of a shadow mask evaporation system and method for forming cross segments 114, connecting segments 116, and connecting segments 118 of receptacle 112 is described in reference to the '715 patent application.

Optionally, one or more shadow masks, such as shadow mask 500, in one or more successive deposition stages, respectively, of an evaporation process may be required for forming the full arrangement of connecting segments 116 and 118 for any given display design, depending on the pitch of the design, for example, a shadow mask that includes only apertures 516 and another shadow mask that includes only apertures 518. The requirement is that the structural integrity and strength of the shadow masks, such as shadow mask 500, be suitably maintained with any given layout of apertures 516 and/or apertures 518.

Figure 6:
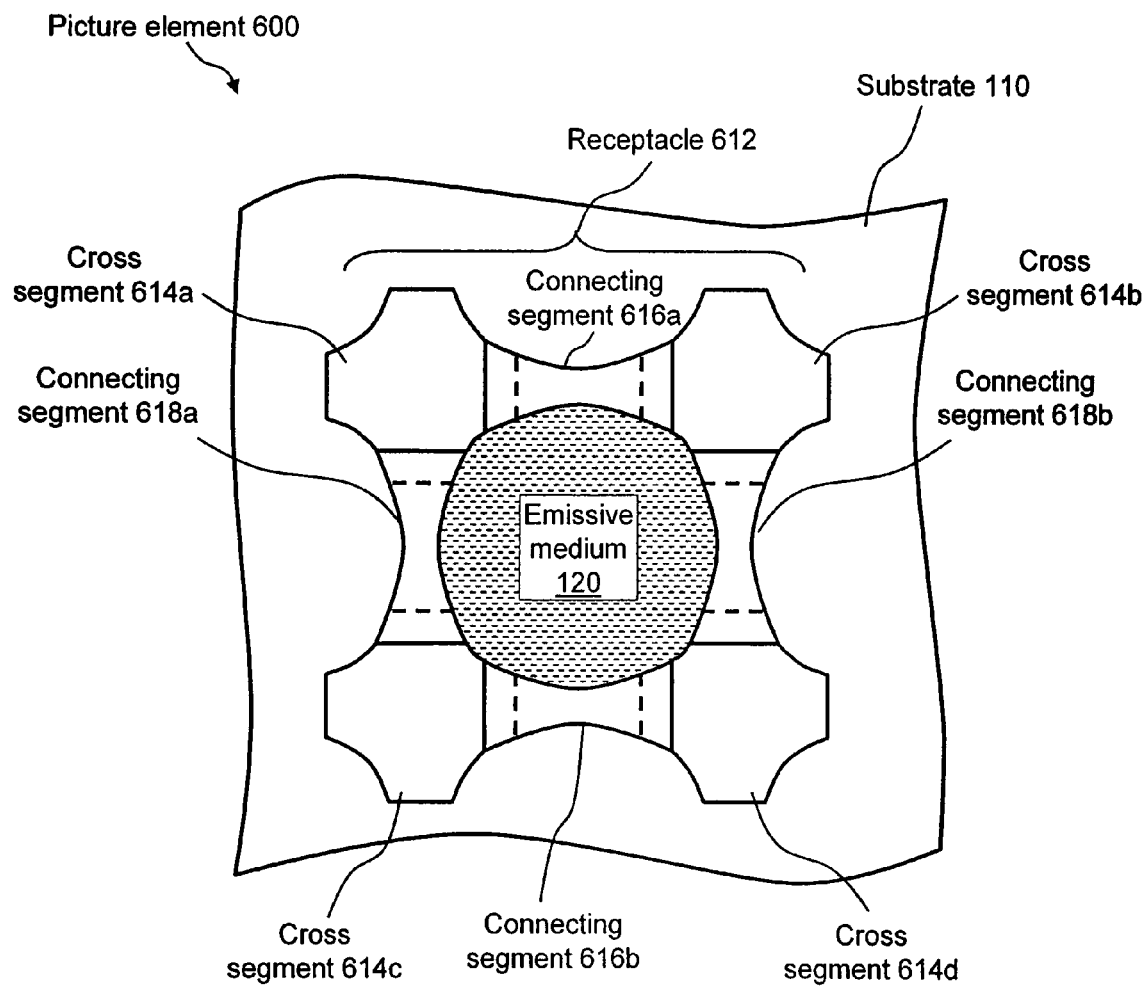
FIG. 6 illustrates a top view of a picture element in accordance with a second embodiment of the invention.

FIG. 6 illustrates a top view of a picture element 600 in accordance with a second embodiment of the invention. Picture element 600 is a representative pixel of a flat-panel display, such as a PLED or OLED display. Picture element 600 includes substrate 110, upon which is formed a receptacle 612. Receptacle 612 is formed by an arrangement of evaporated segments and is formed of a plurality of cross segments 614, arranged on a grid, that are interconnected via a plurality of connecting segments 616 and connecting segments 618, which form the walls of receptacle 612 for retaining liquid solvent during an inkjet deposition process.

In this example, receptacle 612 is formed of a cross segment 614a, a cross segment 614b, a cross segment 614c, and a cross segment 614d, arranged on a grid, as shown in FIG. 6. Cross segments 614a and 614b are interconnected via a connecting segment 616a to form a first wall of receptacle 612; cross segments 614c and 614d are interconnected via a connecting segment 616b to form a second wall of receptacle 612; cross segments 614a and 614c are interconnected via a connecting segment 618a to form a third wall of receptacle 612; and cross segments 614b and 614d are interconnected via a connecting segment 618b to form a fourth wall of receptacle 612.

Deposited within the walls of receptacle 612 that are formed by the combination of cross segments 614, connecting segments 616, and connecting segments 618 is a quantity of emissive medium 120.

Cross segments 614, connecting segments 616, and connecting segments 618 of receptacle 612 are formed via a shadow mask evaporation process. The material for forming cross segments 614, connecting segments 616, and connecting segments 618 is an organic hydrophobic material that is suited for use with an inkjet deposition process and also suited for use with the shadow mask evaporation manufacturing process, as described in FIG. 1. Further details of the formation of cross segments 614, connecting segments 616, and connecting segments 618 of receptacle 612 via the shadow mask evaporation process are found in reference to FIGS. 7 and 8.

As compared with picture element 100 of FIG. 1, picture element 600 illustrates an example alternative shape for a receptacle of a display. More specifically, picture element 100 of FIG. 1 results in emissive medium 120 forming in a square shape, whereas picture element 600 of FIG. 6 results in emissive medium 120 forming in a circular shape. The shape of the receptacles of the present invention are not limited to square or circular; any desired shape or geometry, such as rectangular, square, circular, or oval, is within the scope of this invention.

Figure 7:
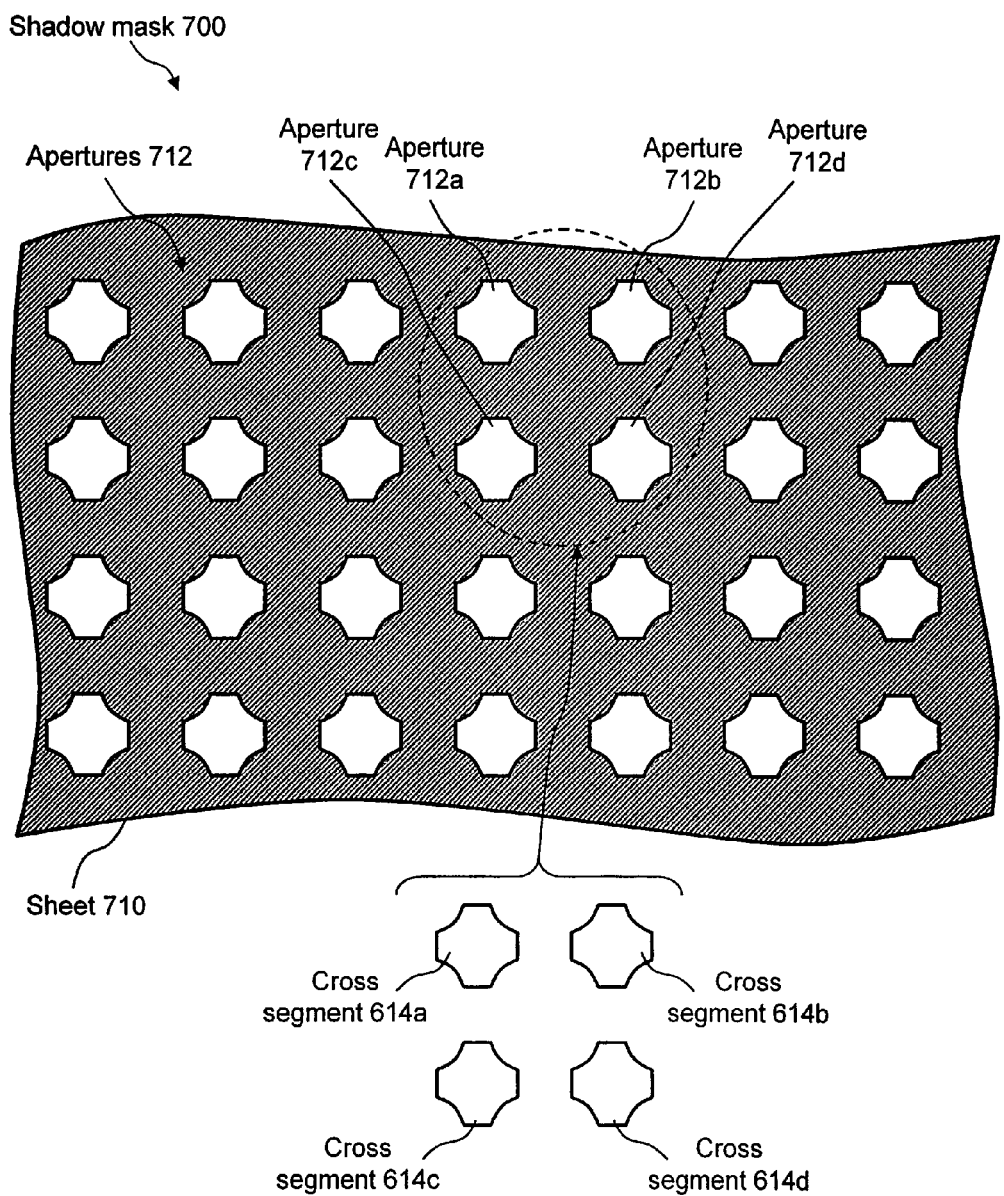
FIG. 7 illustrates a top view of an exemplary shadow mask for forming an arrangement of receptacle cross segments via a shadow mask vacuum deposition process in accordance with a second embodiment of the invention.

FIG. 7 illustrates a top view of an exemplary shadow mask 700 for forming an arrangement of cross segments 614 of a plurality of receptacles 612 via a shadow mask vacuum deposition process in accordance with a second embodiment of the invention. Shadow mask 700 includes a sheet 710 formed of, for example, nickel, chromium, steel, copper, Kovar, or Invar. Formed within sheet 710 is a pattern of apertures 712, which are openings of a predetermined size, shape, and location, for forming an arrangement of cross segments 614. With reference to FIGS. 6 and 7, shadow mask 700 includes, for example, an aperture 712a for forming cross segment 614a, an aperture 712b for forming cross segment 614b, an aperture 712c for forming cross segment 614c, and an aperture 712d for forming cross segment 614d.

The location of apertures 712 are set on a pitch, as determined by an associated layout of picture elements 600 for a given display design. More specifically, the pitch of apertures 712 is dependent on the number of pixels per inch of a given display design. For example, the pitch of apertures 712 may be in the range of 100 to 500 µm, which equates to 250 to 50 pixels per inch, respectively.

Shadow mask 700 is suitable for use in a vacuum vessel of one deposition stage of an evaporation system. An example shadow mask evaporation system and method for forming cross segments 614, connecting segments 616, and connecting segments 618 of receptacle 612 is described in reference to the '715 patent application.

Optionally, one or more shadow masks, such as shadow mask 700, in one or more successive deposition stages, respectively, of an evaporation process may be required for forming the full arrangement of cross segments 614 for any given display design, depending on the pitch of the design. The requirement is that the structural integrity and strength of the shadow masks, such as shadow mask 700, be suitably maintained with any given layout of apertures 712.

Figure 8:
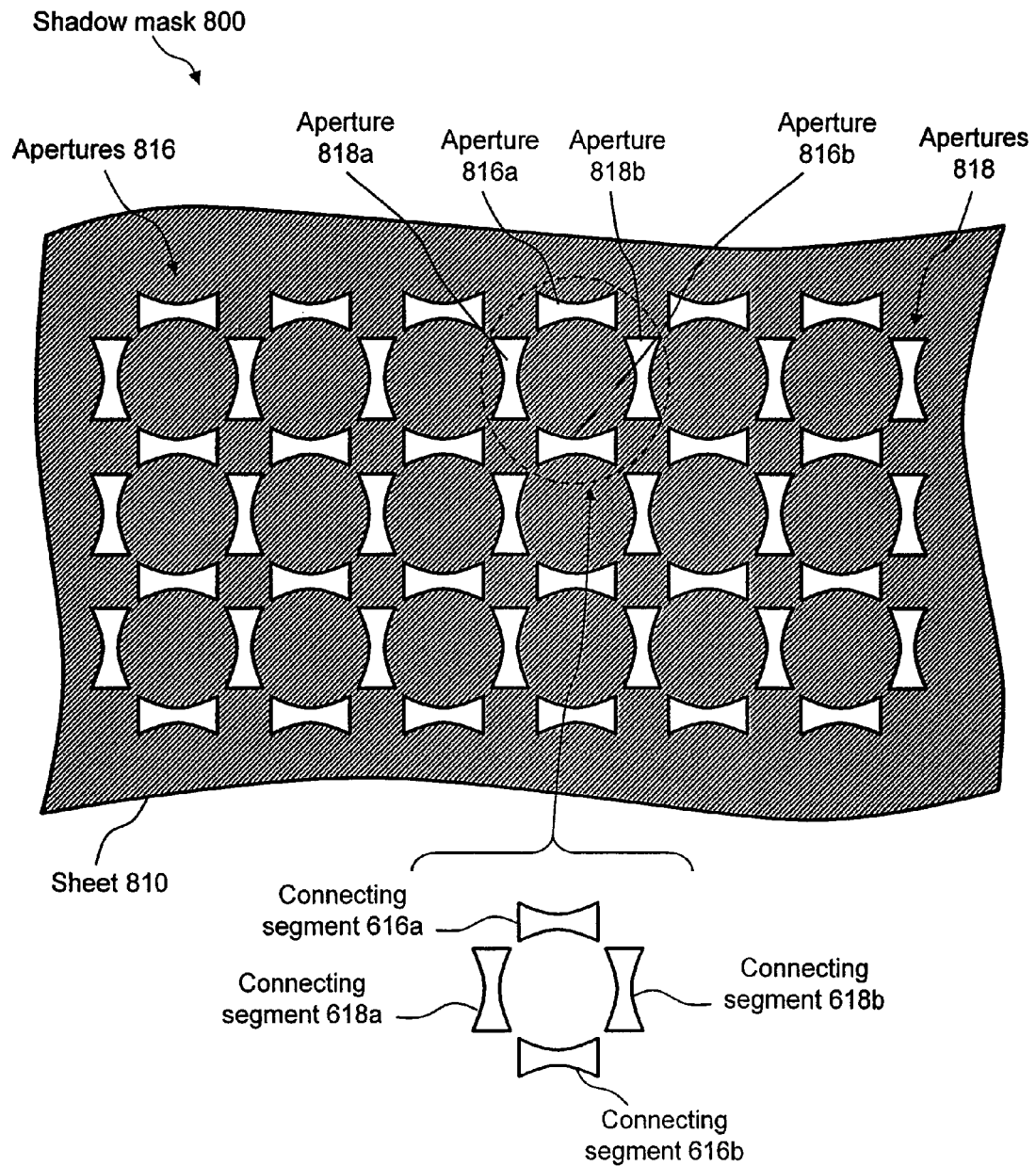
FIG. 8 illustrates a top view of an exemplary shadow mask for forming an arrangement of receptacle connecting segments via a shadow mask vacuum deposition process in accordance with a second embodiment of the invention.

FIG. 8 illustrates a top view of an exemplary shadow mask 800 for forming an arrangement of connecting segments 616 and connecting segments 618 of a plurality of receptacles 612 via a shadow mask vacuum deposition process in accordance with a second embodiment of the invention. Shadow mask 800 includes a sheet 810 formed of, for example, nickel, chromium, steel, copper, Kovar, or Invar. Formed within sheet 810 is a pattern of apertures 816 and apertures 818, which are openings of a predetermined size, shape, and location, for forming an arrangement of connecting segments 616 and 618, respectively. With reference to FIGS. 6 and 8, shadow mask 800 includes, for example, an aperture 816a for forming connecting segment 616a, an aperture 816b for forming connecting segment 616b, an aperture 818a for forming connecting segment 618a, and an aperture 818b for forming connecting segment 618b.

The location of apertures 816 and 818 are set on a pitch, as determined by an associated layout of picture elements 600 for a given display design. More specifically, the pitch of apertures 816 and 818 is dependent on the number of pixels per inch of a given display design. For example, the pitch of apertures 816 and 818 may be in the range of 100 to 500 µm, which equates to 250 to 50 pixels per inch, respectively.

Shadow mask 800 is suitable for use in a vacuum vessel of one deposition stage of an evaporation system. An example shadow mask evaporation system and method for forming cross segments 614, connecting segments 616, and connecting segments 618 of receptacle 612 is described in reference to the '715 patent application.

Optionally, one or more shadow masks, such as shadow mask 800, in one or more successive deposition stages, respectively, of an evaporation process may be required for forming the full arrangement of connecting segments 616 and 618 for any given display design, depending on the pitch of the design, for example, a shadow mask that includes only apertures 816 and another shadow mask that includes only apertures 818. The requirement is that the structural integrity and strength of the shadow masks, such as shadow mask 800, be suitably maintained with any given layout of apertures 816 and/or apertures 818. Additionally, the deposition sequence of the receptacle components is not critical and can be altered without material change to the resultant receptacles.

Figure 9:
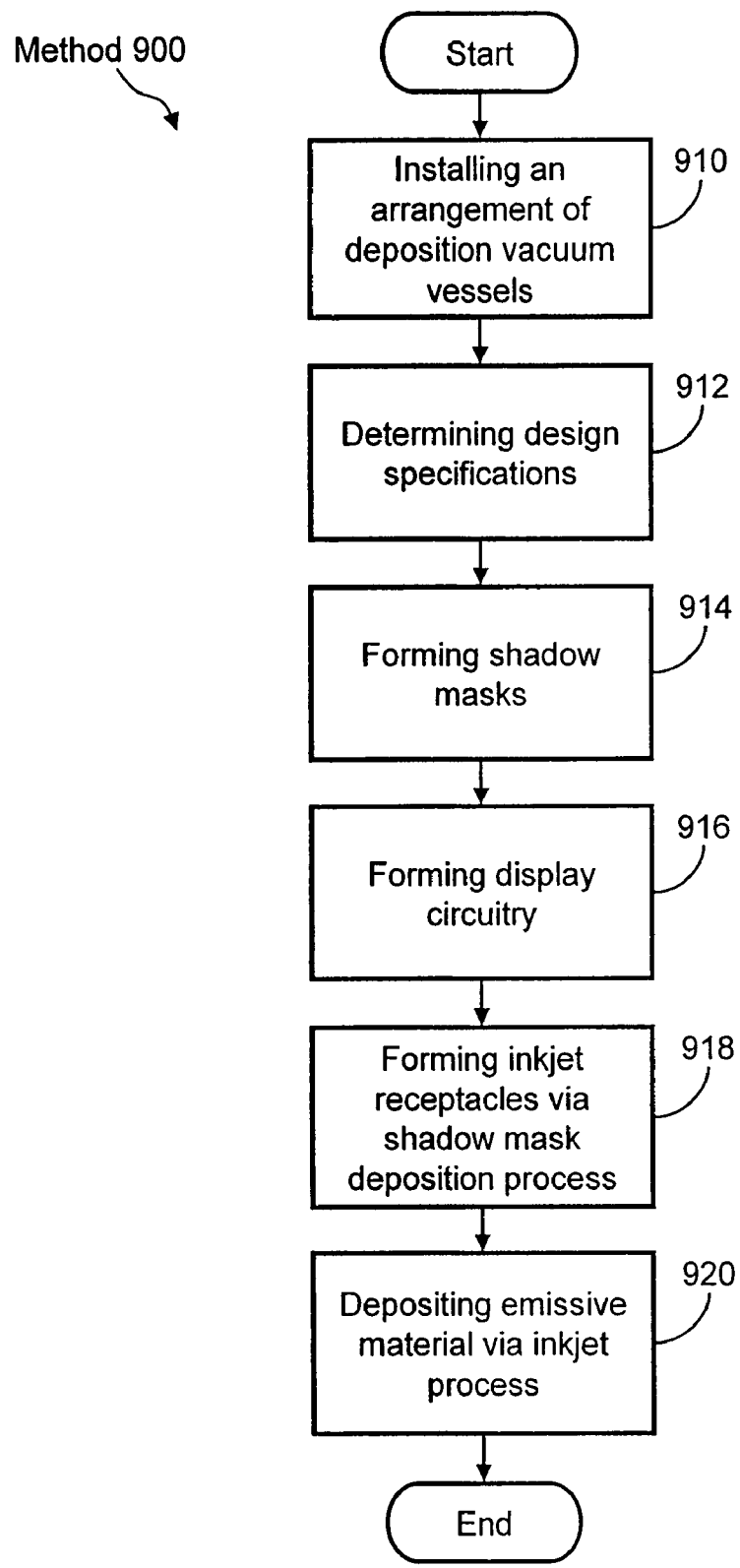
FIG. 9 illustrates a flow diagram of a method of making inkjet receptacles via a shadow mask vacuum deposition process and using same in accordance with the invention.

FIG. 9 illustrates a flow diagram of a method 900 of making inkjet receptacles via a shadow mask vacuum deposition process and using same in accordance with the invention. With continuing reference to FIGS. 1 through 8, method 900 includes the following steps.

At step 910, an arrangement of deposition vacuum vessels is installed in a serial arrangement to form a shadow mask vacuum deposition system, such as described in reference to the '715 patent application.

At step 912, the design specifications of the specific tight emissive display to be formed via the shadow mask vacuum deposition system are determined.

At step 914, a set of shadow masks, such as shadow masks 400, 500, 700, or 800, for forming receptacles, such as a plurality of receptacles 112 or 612, suitable for use with an inkjet printing deposition process are formed. The plurality of apertures within each shadow mask is arranged according to the predetermined pattern for each segment of the receptacle structure.

At step 916, circuitry associated with the display is formed upon a substrate, such as substrate 110, via any well-known manufacturing process. The outmost layer is an arrangement of electrodes, such as electrodes 122, formed of an electrically conductive hydrophilic material, as described in reference to FIG. 3A.

At step 918, an arrangement of receptacle structures is formed upon a substrate, such as a plurality of receptacles 112 or 612 upon substrate 110. The receptacles are formed via one or more shadow mask vacuum deposition events by use of the set of shadow masks of step 914 within the shadow mask vacuum deposition system of step 910. More specifically, a hydrophobic material, as described in reference to FIG. 1, is deposited upon the hydrophilic electrodes to form the structure of the receptacles.

At step 920, a solution, such as solution 124, which is a solvent with a polymer dissolved therein, is deposited within the receptacles formed at step 918 via a standard inkjet deposition process. During the inkjet deposition process, a printhead sweeps across the area of the target display, such as light-emitting display 200 of FIG. 2, and delivers droplets of solution 124 of a predetermined volume into the receptacles 112 thereof. By doing so, each receptacle 112 is filled or slightly overfilled to a uniform level with a predetermined quantity of solution 124, as shown in FIG. 3B. The droplets of solution 124 are repelled by the hydrophobic material that form the walls of each receptacle 112, while, at the same time, the droplets of solution 124 are pulled into each receptacle 112 by the surface energy of the hydrophilic material of electrode 122. In this way, each droplet of solution 124 is drawn to its intended location within each picture element 100 of the target display, such as light-emitting display 200 of FIG. 2. The display then experiences a drying event, whereby the liquid within solution 124 evaporates and leaves behind only the solids within solution 124 as a thin, solid, uniform layer of emissive material, i.e., emissive medium 120. Method 900 ends.

Although the invention has been described in detail in connection with the exemplary embodiments, it should be understood that the invention is not limited to the above disclosed embodiments. Rather, the invention can be modified to incorporate any number of variations, alternations, substitutions, or equivalent arrangements not heretofore described, but which are commensurate with the spirit and scope of the invention. Accordingly, the invention is not limited by the foregoing description or drawings, but is only limited by the scope of the appended claims.

What is claimed as new and desired to be protected by Letters Patent Of the United State is:

1. An organic light-emitting diode (OLED) electronic display assembly or polymeric light-emitting diode (PLED) electronic display assembly, comprising:
    a substrate;
    at least one receptacle structure disposed over the substrate, wherein the receptacle structure comprises a plurality of cross segments arranged in a grid over the substrate and a plurality of connecting segments for interconnecting the cross segments and wherein ends of each connecting segment overlap ends of corresponding cross segments; and
    a light-emissive material contained in the receptacle structure.

2. The OLED or PLED electronic display assembly of claim 1, wherein the receptacle structure has a predetermined configuration that allows a predetermined volume of a light-emissive material to be contained within the receptacle structure.

3. The OLED or PLED electronic display assembly of claim 1, wherein the light-emissive material is an inkjet deposited light-emissive material.

4. The OLED or PLED electronic display assembly of claim 1, further comprising at least one electrode disposed on the substrate and under the receptacle structure.

5. An organic light-emitting diode (OLED) electronic display assembly or polymeric light-emitting diode (PLED) electronic display assembly, comprising:
    a substrate;
    an electrode formed on the substrate;
    a plurality of receptacles provided over the substrate, wherein the receptacles each comprise a plurality of cross segments arranged in a grid over the substrate and a plurality of connecting segments for interconnecting the cross segments and wherein ends of each connecting segment overlap ends of corresponding cross segments; and
    an emissive medium provided within each of the plurality of receptacles.

6. The OLED or PLED electronic display assembly of claim 5, wherein the emissive medium forms an active display element.

7. The OLED or PLED electronic display assembly of claim 6, wherein the active display element is a light-emitting device.

* * * * *